(12) United States Patent
Kojima et al.

(10) Patent No.: US 6,294,949 B1
(45) Date of Patent: Sep. 25, 2001

(54) VOLTAGE DRIVE CIRCUIT, VOLTAGE DRIVE APPARATUS AND SEMICONDUCTOR-DEVICE TESTING APPARATUS

(75) Inventors: Shoji Kojima; Takashi Sekino, both of Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 09/588,615

(22) Filed: Jun. 6, 2000

(30) Foreign Application Priority Data

Jun. 7, 1999 (JP) ................................. 11-160082

(51) Int. Cl.[7] ................................. G05F 1/10; H03K 5/22
(52) U.S. Cl. ................................. 327/538; 327/65; 327/77
(58) Field of Search ................................. 327/63, 65–67, 327/69, 70, 77, 89, 560–563, 52, 54, 538, 541, 543, 362, 333, 108; 324/158.1, 765

(56) References Cited

U.S. PATENT DOCUMENTS

| | | | |
|---|---|---|---|
| 4,560,921 | * 12/1985 | Yamatake | 327/77 |
| 4,972,517 | * 11/1990 | Kondou et al. | 327/65 |
| 5,268,872 | * 12/1993 | Fujii et al. | 327/77 |
| 5,471,169 | * 11/1995 | Dendinger | 327/538 |

* cited by examiner

Primary Examiner—Toan Tran
(74) Attorney, Agent, or Firm—Pillsbury Winthrop LLP (57) ABSTRACT

A circuit includes a first current path formed by a resistance R2, a transistor Q2, a transistor Q5 and a resistance R5. When an input signal A is low, a current i4 flows through the first circuit and the circuit outputs a shift voltage shifted from a constant voltage. When the input signal is high, the circuit directly outputs the constant voltage VH. The circuit further includes a second current path formed by a resistance R3 and a transistor Q3. By running a simulation current through the second current path, the shift voltage is monitored by a comparator OP1, and the current i4 is adjusted.

30 Claims, 8 Drawing Sheets

RELATED ART

VOLTAGE DRIVE CIRCUIT, VOLTAGE DRIVE APPARATUS AND SEMICONDUCTOR-DEVICE TESTING APPARATUS

This patent application claims priority based on a Japanese patent application, H11-160082 filed on Jun. 7, 1999, the contents of which are incorporated herein by reference.

BACKGROUND OF THE INVENTION

1. Field of the Invention

The present invention relates to a voltage drive circuit, a voltage drive apparatus and a semiconductor-device testing apparatus. More particularly, the present invention relates to a voltage drive circuit generating voltage in accordance with an input signal, a voltage drive apparatus including the voltage drive circuit, and a semiconductor-device testing apparatus including the voltage drive circuit and the voltage drive apparatus.

2. Description of the Related Art

Among a test list for testing a semiconductor-device, there are a lot of test items related to an operational margin of the semiconductor-device, which is a device under test and will be simply referred to as a DUT hereinafter. In order to secure the performance conditions for the DUT that the DUT is operated under, which is a power voltage ranging between 3 volt±10%, a semiconductor-device testing apparatus for testing the DUT needs to test the DUT using an input signal having same range of the voltage as the performance conditions of the DUT under the power voltage of that range. Considering an input signal A having a voltage of 3 volts, the semiconductor-device testing apparatus is required to output the input signal A with a maintained logic value, but shifted voltage to between 2.7 volts to 3.3 volts. Therefore, a voltage drive circuit that outputs the input signal A as varying voltage should be incorporated.

Figure 1:
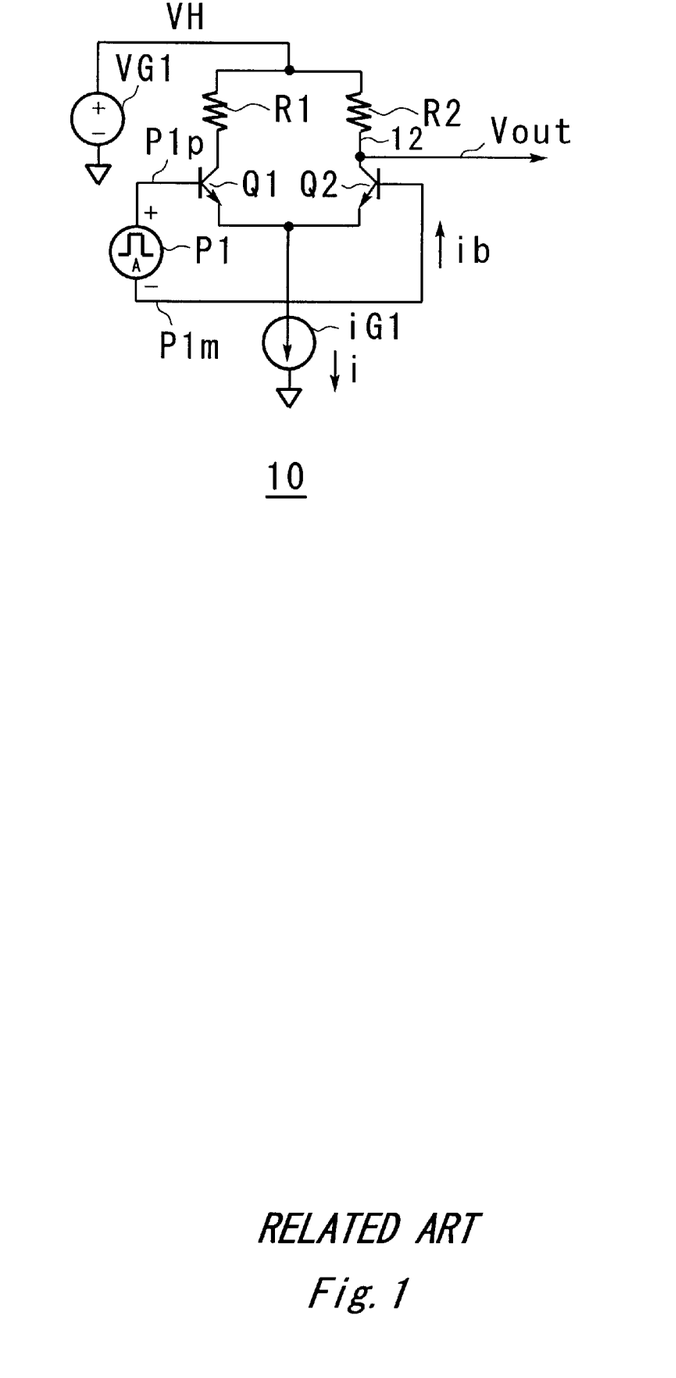
FIG. 1 shows a structure of a conventional voltage drive circuit.

FIG. 1 shows a structure of a conventional voltage drive circuit 10. The input signal A is generated by a pulse generator P1 as a differential signal. The input signal A can take two values including a high value whose logic value is one, and a low value whose logic value is zero. When the input signal A is high, it means that the input signal A takes the high value, a positive output P1p from the pulse generator P1 becomes high and a negative output P1m becomes low. The positive output P1p of the pulse generator P1 is connected to a base of the transistor Q1, and the negative output P1m of the pulse generator P1 is connected to a base of the transistor Q2. Thus, when the input signal A is high, the transistor Q1 is switched on and the transistor Q2 is switched off. When, on the other hand, the input signal A is low, the transistor Q1 is switched off and the transistor Q2 is switched on. As the voltage drive circuit 10 is constructed such that either of the transistors Q1 and Q2 is switched on when the other of the transistors Q1 and Q2 is switched on, the current flowing in the voltage drive circuit 10 can be kept constant. Thus, the variation of the power voltage of the circuit 10 can be reduced and the circuit 10 can be operated at high-speed.

An emitter of the transistor Q1 and an emitter of the transistor Q2 are connected to a current drive circuit iG1 that generates a constant current i. A collector of the transistor Q1 and a collector of the transistor Q2 are connected to a constant voltage source VG1 respectively via the resistance R1 and the resistance R2. The constant voltage source VG1 generates a voltage VH. In this circuit 10, the signal is output from an output point 12 located between the resistance R2 and the transistor Q2, as an output voltage Vout. The output signal maintains its logic value, but has the output voltage Vout which is different from that of the input signal A.

In the above structure, the transistor Q2 is switched on when the input signal A is low, and the constant current i flows through the resistance R2. At this time, the output voltage Vout becomes Vout=VH−i*R2 (formula 1). On the other hand, the transistor Q2 is not switched on when the input signal A is high, and the constant current i flows through the transistor Q1. At this time, the output voltage Vout becomes Vout=VH (formula 2). As described above, the input signal A can take two values including high and low. Thus, the output voltage of the input signal A can be varied in accordance with either of the formulas 1 and 2 which are obtained depending on the values of the input signal A.

However, due to recent developments in semiconductor techniques, performances of semiconductor-devices are highly advanced. Thus, the semiconductor-device testing apparatus needs to have precise performance.

As for the circuit 10 shown in FIG. 1, for example, a base current ib is actually input to the base of the transistor Q2 and thus the actual output voltage Vout does not match the value obtained in accordance with the above formula 1. The base current is a nonlinear function depending on voltage between the collector and the emitter, and a collector current. Furthermore, the base current can easily be affected by errors caused during manufacturing. Thus, it is difficult to adjust the circuit by the base current ib taking into consideration.

SUMMARY OF THE INVENTION

Therefore, it is an object of the present invention to provide a voltage drive circuit, a voltage drive apparatus and a semiconductor-device testing apparatus capable of precisely setting an output voltage which overcomes the above issues in the related art. This object is achieved by combinations described in the independent claims. The dependent claims define further advantageous and exemplary combinations of the present invention.

According to the first aspect of the present invention, a voltage drive circuit generating a voltage in accordance with an input signal, comprises: an output voltage generator including: a current drive circuit having a current adjustable terminal; an output voltage generating transistor being switched on and off in accordance with the input signal; an output voltage generating resistance through which a current flows when the output voltage generating transistor is in a first operational state and being switched on; and an output point where an output voltage which is shifted from a predetermined voltage is generated by a voltage drop caused at both ends of the output voltage generating resistance; and an output voltage monitor including a comparator comparing the shifted output voltage with a predetermined expected voltage, wherein an output from the comparator is connected to the current adjustable terminal of the current drive circuit.

The output voltage monitor may include a reference voltage generating circuit generating a reference voltage whose ratio to the shifted output voltage is a predetermined value, and the comparator may compare the reference voltage with the expected voltage.

The reference voltage generating circuit may include: a reference current drive circuit, a reference transistor being switched on and off and capable of being in a predetermined operational state; and a reference resistance through which a current flows, the current flows through the reference current drive circuit via the reference transistor.

The reference transistor may have a structure such that current flowing therethrough is 1/k (k is a positive real number) times as large as current flowing through the output voltage generating transistor, when both of the reference transistor and the output voltage generating transistor are switched on, and the reference resistance may have a resistance value which is k times as large as a resistance value of the output voltage generating resistance.

The reference current drive circuit may have a current adjustable terminal, and an output of the comparator may be connected to the current adjustable terminal of the reference current drive circuit.

The first operational state for the output voltage generating transistor and the predetermined operational state for the reference transistor may be such that both of the transistors are switched on or both of the transistors are switched off, and the reference voltage may become equal to the shifted output voltage when the output voltage generating transistor is in the first operational state.

The input signal may be input to a base of the output voltage generating transistor and is capable of taking two types of values, and one of the two types of values of the input signal may be constantly input to a base of the reference transistor.

The predetermined voltage may be set to be higher than a ground voltage, the output voltage generating transistor may be an NPN type transistor; and the output voltage generating resistance, the output point, and the output voltage generating transistor may be cascaded with each other in this order, between the predetermined voltage and the ground voltage.

The reference transistor may be an NPN type transistor, the reference resistance and the reference transistor maybe cascaded with each other in this order, between the predetermined voltage and the ground voltage, and the reference voltage may be generated between the reference resistance and the reference transistor.

According to the first aspect of the present invention, a voltage drive circuit generating a voltage in accordance with an input signal, comprises: an output voltage generator including: a first circuit generating a predetermined voltage and an output voltage which is shifted from the predetermined voltage in accordance with a value of the input signal; and an output point where the shifted output voltage is generated; and an output voltage monitor including: a second circuit generating a reference voltage whose ratio to the shifted output voltage is a predetermined value; and a comparator comparing the reference voltage with a predetermined expected voltage; wherein the shifted output voltage shifted by the output voltage generator is adjusted based on an output from the comparator.

The first circuit generating the shifted output voltage may include a first current path through which different currents flow in accordance with values of the input signal, and generates the shifted output voltage by the current flowing through the first current path; and the second circuit generating the reference voltage may include a second current path through which a current whose ratio to a maximum current flowing through the first current path is a predetermined value flows, and generates the reference voltage by the current flowing through the second current path.

The the first current path may be formed by: an output voltage generating transistor being switched on and off in accordance with the input signal; and an output voltage generating resistance through which a current flows when the output voltage generating transistor is in a first operational state; and the second current path may be formed by: a reference transistor being switched on and off and capable of being in a predetermined operational state; and a reference resistance through which a current flows, the current flowing through the reference transistor.

The output voltage generator may further include a third current path through which a current flows, and sum of the current flowing in the first current path and the current flowing in the third current path is constant, and the output voltage monitor may further include a fourth current path through which a current whose ratio to a minimum current flowing through the third current path is a predetermined value.

The third current path may be formed by: a first complementary transistor compensating the output voltage generating transistor; and a first complementary resistance through which a current flows when the first complementary transistor is in a first operational state; and the fourth current path may be formed by: a second complementary transistor having an opposite operational state against the predetermined operational state of the reference transistor; and a second complementary resistance through which a current flows, the current flowing through the second complementary transistor.

The first current path and the third current path may be connected to a main current drive circuit, the main current drive circuit being controlled by an output from the comparator.

The second current path and the fourth current path may be connected to a sub current drive circuit, the sub current drive circuit being controlled by an output from the comparator.

The input signal may be input to a base of the output voltage generating transistor, and one of two types of voltages of the input signal is input to a base of the reference transistor.

A reversed signal of the input signal may be input to a base of the first complementary transistor, and the other of two types of voltages of the input signal is input to a base of the second complementary transistor.

According to the third aspect of the present invention, a voltage drive circuit comprises first to nth (n is an integer equal or larger than two) voltage drive circuits as set forth in claim 1, wherein the expected voltages for each of the first to nth voltage drive circuits are set to have different values; and the output points for each of the first to nth voltage drive circuits are connected with each other.

The voltage drive circuit may further comprise a connection circuit connecting a first shift voltage which is a differential voltage of the predetermined voltage and the shifted output voltage of the first voltage drive circuit, to the second voltage drive circuit.

The connection circuit may generate an adjusted second shift voltage by adding the first shift voltage to a second shift voltage which is a differential voltage of the predetermined voltage and the shifted output voltage of the second voltage drive circuit.

The first voltage drive circuit and the second voltage drive circuit may be constructed so as to be compensating each other, the first voltage drive circuit may be located so as to be operated under a voltage ranging from a ground voltage to a first voltage higher than the ground voltage, and the second voltage drive circuit may be located so as to be operated under a voltage ranging from the first voltage to a second voltage higher than the first voltage.

The comparator may be constructed so as to be shared by the first voltage drive circuit and the second voltage drive circuit, and the voltage drive circuit may further comprise a selecting circuit selecting either of the first voltage drive circuit and the second voltage drive circuit such that the first voltage drive circuit functions when the expected voltage is lower than the first voltage input to the shared comparator, and the second voltage drive circuit functions when the expected voltage is higher than the first voltage.

According to the fourth aspect of the present invention, an apparatus for testing a semiconductor-device, comprises: a test data generator generating a logic signal to be applied to the semiconductor-device; a voltage drive unit converting the logic signal to a test signal having a desired voltage; and a failure analyzer judging whether the semiconductor-device has a failure or not by reading data from the semiconductor-device; wherein the voltage drive unit includes a voltage drive circuit as set forth in claim 1, receiving the logic signal as an input signal and outputting the test signal as a shifted output voltage.

According to the fifth aspect of the present invention, a voltage drive apparatus comprises a first voltage drive circuit generating a voltage in accordance with a first input signal and a second voltage drive circuit generating a voltage in accordance with a second input signal.

The first voltage drive circuit comprises: a first output voltage generator including: a first current drive circuit having a first current adjustable terminal; a first output voltage generating transistor being switched on and off in accordance with the first input signal; an output voltage generating resistance through which a current flows when the first output voltage generating transistor is in a first operational state, the current flowing through the first current drive circuit; and a first output point where a first output voltage which is shifted from a predetermined voltage is generated by a voltage drop caused at both ends of the output voltage generating resistance, and a first output voltage monitor including a comparator which compares the shifted first output voltage with a predetermined first expected voltage, wherein an output from the comparator being connected to the first current adjustable terminal.

The second voltage drive circuit comprises: a second output voltage generator including: a second current drive circuit having a second current adjustable terminal; a second output voltage generating transistor being switched on and off in accordance with the second input signal; and a second output point where a second output voltage being shifted from a predetermined voltage is generated by a voltage drop caused at both ends of the output voltage generating resistance, by a current flowing through the output voltage generating resistance when the second output voltage generating transistor is in a first operational state, the current flowing through the second current drive circuit, and a second output voltage monitor including a second comparator comparing the shifted second output voltage with a predetermined second expected voltage, an output from the comparator being connected to the second current adjustable terminal.

The first output point and the second output point may be connected with each other.

The first output voltage monitor may include a first reference voltage generating circuit generating a first reference voltage whose ratio to the first output voltage is a predetermined value, the first comparator may compare the first reference voltage with the first expected voltage, the second output voltage monitor may include a second reference voltage generating circuit generating a second reference voltage whose ratio to the second output voltage is a predetermined value, and the second comparator may compare the second reference voltage with the second expected voltage.

The first output voltage generator may include a first complementary transistor compensating the first output voltage generating transistor, and a first complementary resistance through which a current flows when the first complementary transistor is in a first operational state, the current flowing through the first current drive circuit, and the second output voltage generator includes a second complementary transistor compensating the second output voltage generating transistor.

The second output voltage generator may include a second complementary resistance through which a current flows when the second complementary transistor is in a first operational state, the current flowing through the second current drive circuit.

The voltage drive circuit may further comprise a connection circuit connecting an output from the first complementary resistance to the second complementary transistor.

This summary of the invention does not necessarily describe all necessary features of the present invention. The present invention may also be a sub-combination of the above described features. The above and other features and advantages of the present invention will become more apparent from the following description of embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 2:
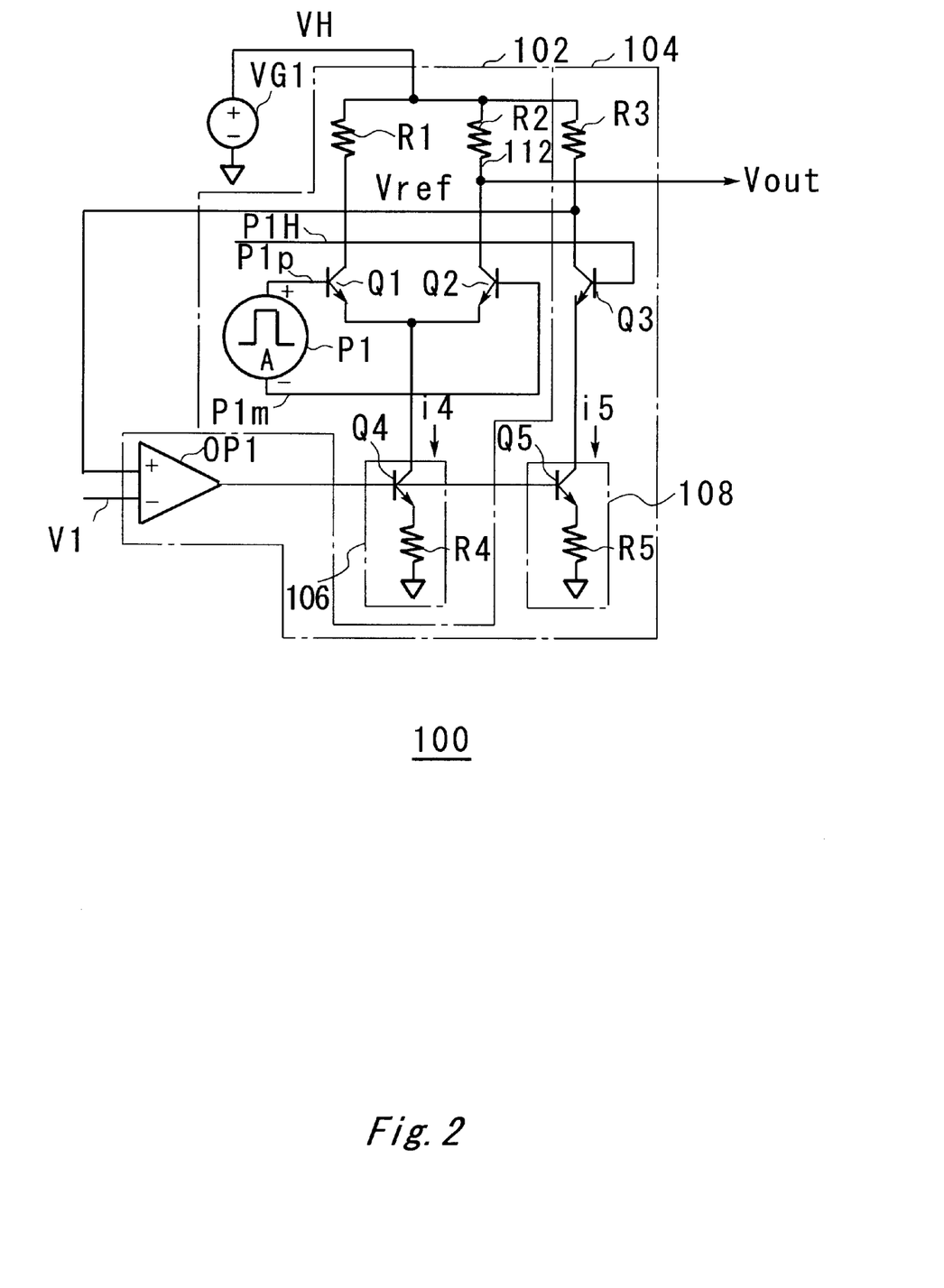
FIG. 2 shows a structure of a voltage drive circuit according to the embodiment of the present invention.

FIG. 2 shows a structure of a voltage drive circuit 100 according to the first embodiment of the present invention. The voltage drive circuit 100 outputs an output signal having a constant voltage VH or an expected voltage V1 as an output voltage Vout, depending on a value of an input signal A.

The voltage drive circuit 100 includes a constant voltage source VG1 generating a constant voltage VH, an output voltage generator 102, and an output voltage monitor 104. The output voltage generator 102 includes a resistance R2, a transistor Q2, a transistor Q4 and a resistance R4, which are cascaded with each other in order to be operated under the voltage between the constant voltage VH and the ground voltage. The resistance R2 and the transistor Q2 generate an output voltage. These elements form a first current path.

The transistor Q4 and the resistance R4 form a current drive circuit 106, a current drive circuit for generating the output voltage, of the output voltage generator 102. For avoiding complication, current paths unnecessarily to explain are not shown in the drawings.

The voltage drive circuit 100 includes a pulse generator P1 generating the input signal A as a differential signal. The input signal A can take two values including a high value whose logic value is one, and a low value whose logic value is zero. When the input signal A is high, it means that the input signal A takes the high value, a positive output P1p from the pulse generator P1 becomes high and a negative output P1m becomes low. When, on the other hand, the input signal A is low, it means that the input signal A takes the low value, the positive output P1p from the pulse generator P1 becomes low and the negative output P1m becomes high.

The output voltage monitor 104 includes a resistance R3, a transistor Q3, a transistor Q5 and a resistance R5, which are cascaded with each other in order to be operated under the voltage between the constant voltage VH and the ground voltage. The resistance R3 and the transistor Q3 generate a reference voltage, which will be explained later. These elements form a second current path. The transistor Q5 and the resistance R5 form a current drive circuit 108, which is a current drive circuit for generating the current voltage of the output voltage monitor 104. The maximum voltage P1H of the pulse generator P1 is constantly input to a base of the transistor Q3, and the transistor Q3 is always switched on. The maximum voltage P1H is almost the same as the high value of the input signal A. The maximum voltage p1H is constantly input in order to monitor the output voltage Vout as will be explained later.

The output voltage generator 102 further includes a resistance R1 and a transistor Q1 which are cascaded with each other in order to operate under the voltage between the constant voltage VH and the ground voltage. The transistor Q1 compensates the current flowing in the output voltage generator 102 by being switched on when the transistor Q2 is switched off, and being switched off when the transistor Q2 is switched on. The resistance R1 and the transistor Q1 form a third current path with the previously mentioned transistor Q4 and resistance R4.

The positive output P1p of the pulse generator P1 is connected to a base of the transistor Q1, and the negative output P1m of the pulse generator P1 is connected to a base of the transistor Q2. Thus, when the input signal A is high, the transistor Q1 is switched on and the transistor Q2 is switched off. When, on the other hand, the input signal A is low, the transistor Q1 is switched off and the transistor Q2 is switched on. As the voltage drive circuit 10 is constructed such that either of the transistors Q1 and Q2 is switched on while the other of the transistors Q1 and Q2 is switched off, the current flowing in the output voltage generator 102 can be kept constant.

The output voltage generator 102(104??) further includes a comparator OP1 comparing a voltage Vref, which is generated between the resistance R3 and the transistor Q3 of the third current path, with a voltage V1. When the input signal A is low, the output voltage Vout should become the voltage V1, which is an expected voltage. An output of the comparator OP1 is connected to a base of the transistor Q4 included in the current drive circuit 106 of the output voltage generator 102, and to a base of the transistor Q5 included in the current drive circuit 108 of the output voltage monitor 104. Therefore, these bases can function as terminals for adjusting currents.

In the above structure, all of the transistors Q1, Q2, Q3, Q4 and Q5 are NPN type transistors. In particular, the transistors Q1 and Q2 have same characteristics, and the resistances R1 and R2 have equal resistance values. The transistors Q2 and Q3 have structures such that the current flowing through the transistor Q3 becomes 1/k (k is a positive real number) times the current flowing through the transistor Q2, when both of the transistors Q3 and Q2 are ideally switched on. For example, the physical size of the transistor Q3 should be 1/k times as large as that of the transistor Q2. The relationship between the transistors Q5 and Q4 is the same as that of the transistors Q3 and Q2. A transistor through which a current 1/k times as much as the transistor flows, will simply be referred to as "a 1/k transistor of the transistor" hereinafter.

On the other hand, the resistance value of the resistance R3 is set to be k times as large as that of the resistance R2. Similarly, the resistance value of the resistance R5 is set to be k times as large as that of the resistance R4. It means that the current flowing in the second current path is 1/k times as large as that in the first current path, but the resistance value in the second current path is k times as large as that in the first current path. Therefore, the same voltage drops can be obtained at all the ends of the resistances R2, R3, R4 and R5. As the output voltage monitor 104 monitors the output voltage Vout of the voltage drive circuit 100, the current flowing in the output voltage monitor 104 should be as small as possible, such that the power supply and the generation of heat in the output voltage monitor 104 can be reduced.

When the input signal A is low, the transistor Q2 of the output voltage generator 102 is switched on and the current flows in the first current path. The transistor Q1 is switched off at this time. Thus, the current flowing through the resistance R2 becomes equal to a current i4 which is the total current flowing through the resistance R4. Therefore, the output voltage Vout becomes Vout=VH−i4*R2 (formula 3).

When, on the other hand, the input signal A is high, the transistor Q2 is not switched on. Therefore, the output voltage Vout becomes Vout=VH (formula 4). As described above, the output voltage Vout can take two types of values, depending on the value of the input signal A.

The transistor Q3 of the output voltage monitor 104 is always switched on, regardless of the value of the input signal A. Therefore, a current i5 flowing through the resistance R5 flows in the second current path. When the input signal A is low, the current i5 is 1/k times as large as the current i4. Considering the resistance value of the resistances R2 and R3, the voltage drops at the ends of the resistance R2 of the output voltage generator 102, and the resistance R3 of the output voltage monitor 104 becomes equal. Thus, the output voltage Vout and the reference voltage Vref become equal to:

$$Vref=VH-i5*R3=VH-(i4/k)*kR2=Vout \quad \text{(formula 5)}.$$

Thus, the output voltage monitor 104 can monitor the reference voltage Vref instead of monitoring the output voltage Vout. The maximum voltage P1H of the pulse generator P1 is input to the base of the transistor Q3 in order to match the operational condition of the transistors Q2 and Q3. It means that when the input signal A is low, the negative output P1m of the pulse generator P1 becomes the same as the maximum voltage P1H of the pulse generator P1. Thus, if the maximum voltage P1H of the pulse generator P1 is originally input to the base of the transistor Q3, the operational condition of the transistors Q2 and Q3 match with each other at this time.

The comparator OP1 compares the reference voltage Vref and the expected voltage V1. The comparator OP1 outputs a negative value when the reference voltage Vref is lower than the expected voltage V1. At this time, the transistor Q4 and Q5 are switched off and the currents i4 and i5 draw to zero. As a result, the voltage drops generated at the ends of the resistances R2 and R3 become smaller and the output voltage Vout and the reference voltage Vref become larger.

On the other hand, the comparator OP1 outputs a positive value when the reference voltage Vref is higher than the expected voltage V1. At this time, the currents i4 and i5 become larger and the voltage drops generated at the ends of the resistance R2 and the resistance R3 become larger. Therefore, the output voltage Vout and the reference voltage Vref become lower. These operations compensate for each other, and finally, the reference voltage Vref becomes equal to the expected voltage V1. Therefore, when the input signal A is low, the expected voltage V1 is output as the output voltage Vout.

Using the voltage drive circuit 100 including the output voltage monitor 104 and the current drive circuit 106, the reference voltage Vref is always monitored and thus the voltage drops generated at the resistance R2 can be adjusted. Therefore, the output voltage Vout can always be set equal to the expected voltage V1 without interference by the base current of the transistor Q2.

When the input signal A is high, the current does not flow in the first current path of the output voltage generator 102. At this time, the output voltage Vout becomes equal to the voltage VH. In this case, the output voltage Vout cannot be monitored. This is the reason why the comparator OP1 does not directly monitor the output voltage Vout but monitors the reference voltage Vref.

The voltage drive circuit 100 outputs the constant voltage VH as the output voltage Vout when the input signal A is high, and directly outputs the expected voltage V1 as the output voltage Vout when the input signal A is low.

Figure 3:
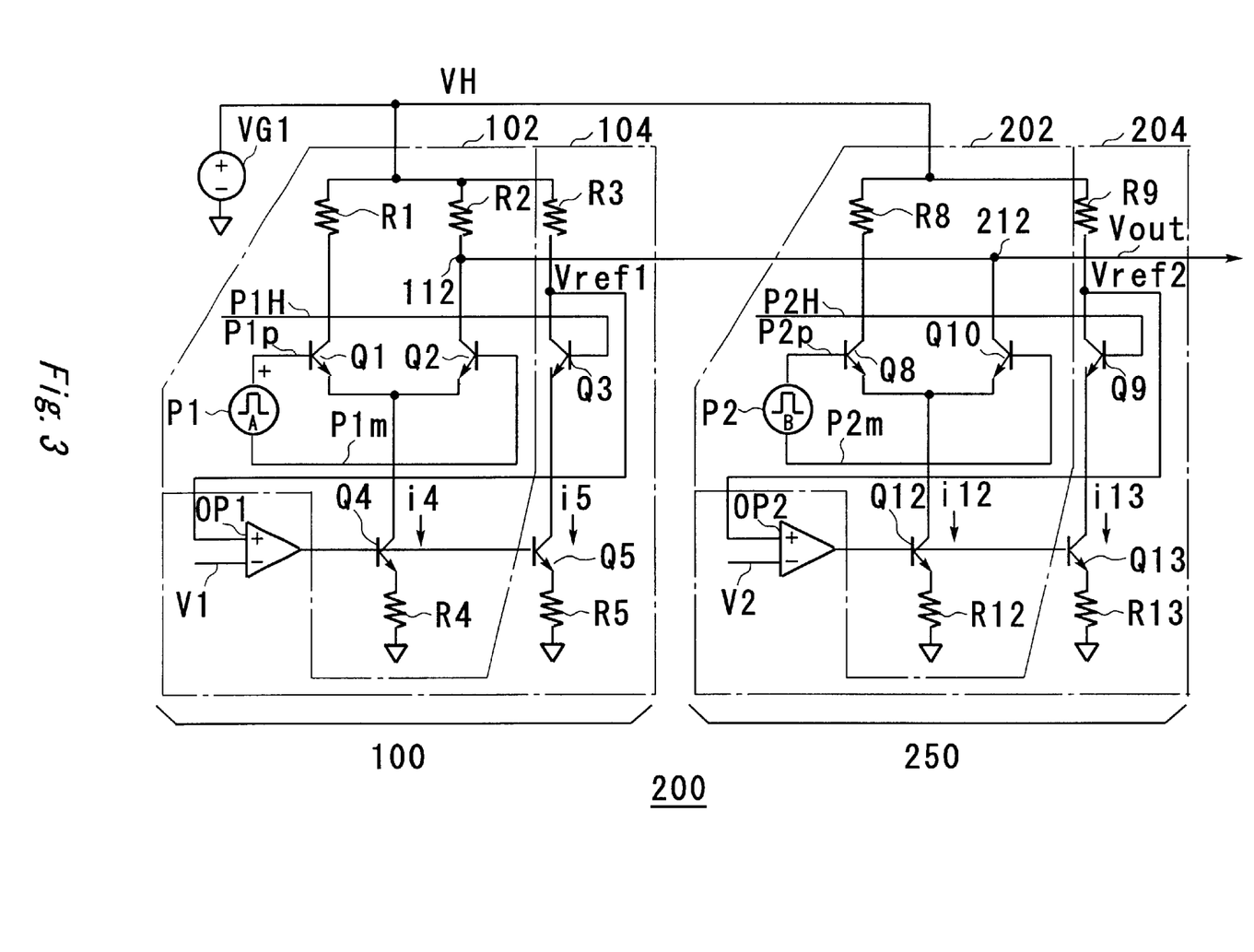
FIG. 3 shows a structure of a voltage drive apparatus including two of the voltage drive circuits shown in FIG. 2.

FIG. 3 shows a structure of a voltage drive apparatus 200 including the voltage drive circuit 100, shown in FIG. 2. The voltage drive apparatus 200 includes the voltage drive circuit 100 and a second voltage drive circuit 250. The voltage drive apparatus 200 outputs a constant voltage VH or expected values V1 or V2 as the output voltage Vout, depending on the values of input signals. The second voltage drive circuit 250 shares the resistance R2 with the output voltage generator 102 of the voltage drive circuit 100.

The second voltage drive circuit 250 includes an output voltage generator 202, which will be simply referred to as "a second output voltage generator 202" hereinafter. The resistance R2, a transistor Q10, a transistor Q12, and a resistance R12 form a first current path, and a resistance R8, a transistor Q8, the transistor Q12 and the resistance R12 form a third current path, in the second voltage drive circuit 250. The second voltage drive circuit 250 includes an output voltage monitor 204, which will be simply referred to as "a second output voltage monitor 204" hereinafter. A resistance R9, a transistor Q9, a transistor Q13 and a resistance R13 form a second current path in the second voltage drive circuit 250.

The second voltage drive circuit 250 includes a pulse generator P2 generating an input signal B. The input signal B can take two values including a high value whose logic value is one, and a low value whose logic value is zero. The positive output P2p of the pulse generator P2 is connected to a base of the transistor Q8, and the negative output P2m of the pulse generator P2 is connected to a base of the transistor Q10. The maximum voltage P2H of the pulse generator P2 is connected to a base of the transistor Q9 of the second current path.

The second output voltage generator 202 further includes a comparator OP2 comparing a reference voltage Vref2, which is generated between the resistance R9 and the transistor Q9, with an expected voltage V2. An output of the comparator OP2 is connected to a base of the transistor Q12 and to a base of the transistor Q13. The output point 112 of the output voltage generator 102 included in the voltage drive circuit 100 is connected to the output point 212 of the second output voltage generator 202. The output voltage Vout is generated at the output point 212.

It is assumed in the above constructed circuits that the input signal A and the input signal B do not become low at the same time. It means that at least one of the input signals A and B is always high.

When, both the input signal A and the input signal B are high, the currents do not flow in either the first current paths of the output voltage generator 102 and the second output voltage generator 202. Thus, the output voltage Vout becomes equal to the constant voltage VH. This is a first value of the output voltage Vout.

When, the input signal A becomes low and the input signal B remains high, the current flows in the first current path of the output voltage generator 102, similar to the previous explanation with reference to FIG. 2. At this time, the reference voltage Vref1 in the second current path of the output voltage monitor 104 becomes equal to the expected voltage V1. Thus, the output voltage Vout becomes equal to the expected voltage V1. This is a second value of the output voltage Vout.

When, the input signal B becomes low and the input signal A remains high, the current flows in the first current path of the second output voltage generator 202. At this time, the reference voltage Vref2 in the second current path of the second output voltage monitor 204 becomes equal to the expected voltage V2. Thus, the output voltage Vout becomes equal to the expected voltage V2. This is a third value of the output voltage Vout. Thus, the voltage drive apparatus 200 is capable of outputting three types of values as the output voltage Vout, depending on the value of the input signals A and B.

Although, it is not assumed here that both the input signal A and the input signal B are low, when both of the signals A and B are low, the output voltage Vout becomes lower than the expected voltage V1 and the expected voltage V2. It is possible to generate these output voltage Vout by setting both of the signals A and B to high.

Furthermore, although the voltage drive apparatus 200 shown in FIG. 3 includes a voltage drive circuit 100 and a second voltage drive circuit 250, the voltage drive apparatus 200 may include many voltage drive circuits 100. By connecting each of the output points respectively included in the voltage drive circuits 100, many types of values can be obtained as the output voltage Vout.

Figure 4:
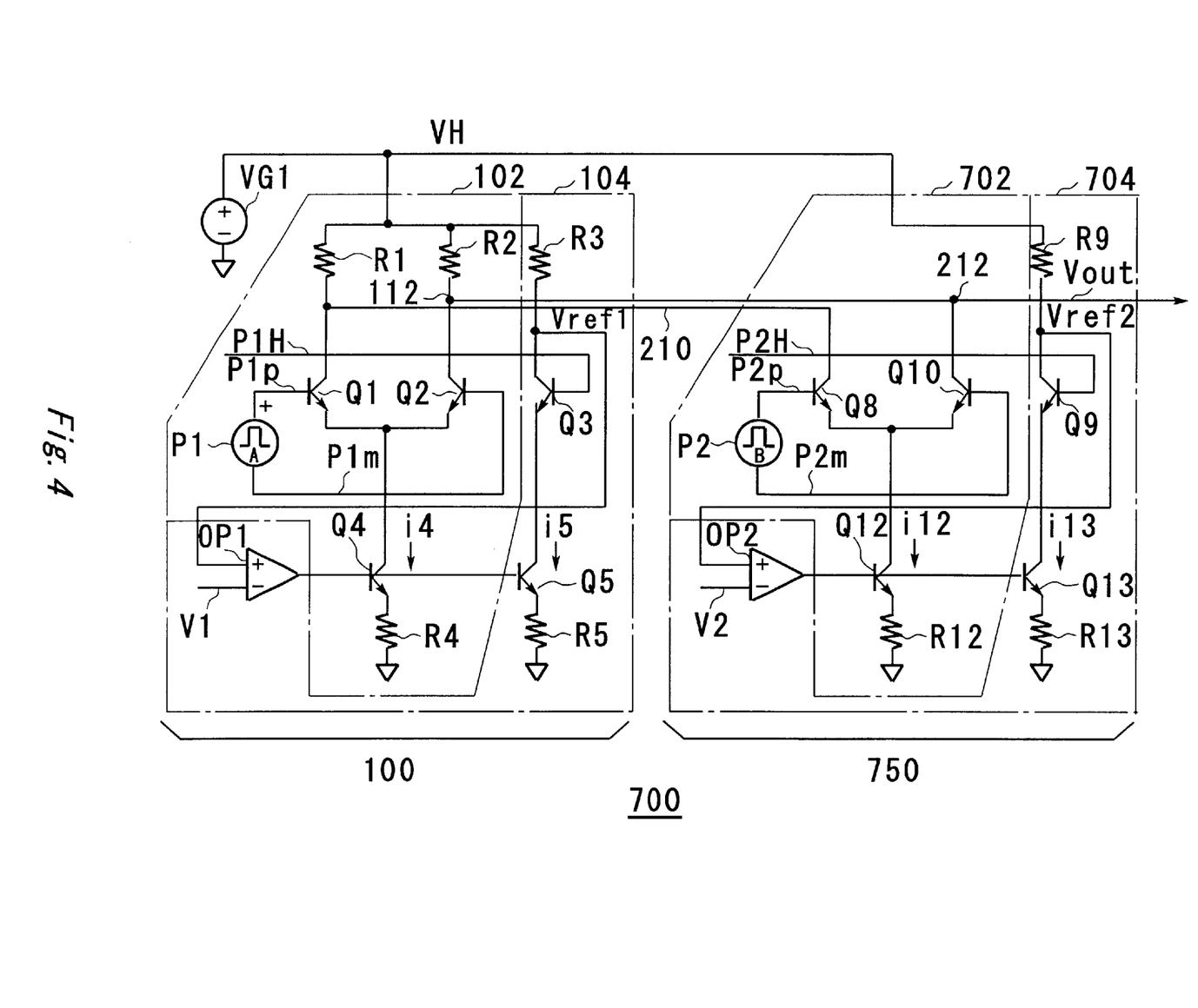
FIG. 4 shows another structure of a voltage drive apparatus including two of the voltage drive circuit shown in FIG. 2.

FIG. 4 shows a structure of a voltage drive apparatus 700 including the voltage drive circuit 100, shown in FIG. 2 and is an altered embodiment of the voltage drive apparatus 200 shown in FIG. 3. The voltage drive apparatus 700 includes a voltage drive circuit 100 and a second voltage drive circuit 750. By setting different values for expected values V1 and V2, which will be explained in the following, the voltage drive apparatus 700 is capable of outputting at least two types of output voltages in addition to the constant voltage. The second voltage drive circuit 750 shares the resistance R2 with the output voltage generator 102 of the voltage drive circuit 100. Different from the voltage drive apparatus 200 shown in FIG. 3, the second voltage drive circuit 750 also shares the resistance R1 with the output voltage generator 102 of the voltage drive circuit 100. As shown in FIG. 4, the voltage drive apparatus 700 includes a connection circuit 210 connecting an output from the resistance R1 to the transistor Q8. The output voltage generator 702 of the second voltage drive circuit 750 will be simply referred to as "a second output voltage generator 702" hereinafter. The second output voltage generator 702 includes a resistance R2, a transistor Q10, a transistor Q12, a resistance R12, a resistor R1, and a transistor Q8. The resistance F2, the transistor Q10, the transistor Q12 and the resistance R12 form a first current path. The resistor R1, the transistor Q8, the transistor Q12 and the resistance R12 form a third current path.

The second voltage drive circuit 750 includes an output voltage monitor, which will be simply referred to as "a second output voltage monitor 704" hereinafter. The second output voltage monitor 704 includes a resistance R9, a transistor Q9, transistor Q13, and a resistance R13 forming a second current path. The second voltage drive circuit 750 further includes a pulse generator P2 generating an input signal B. The positive output P2p from the pulse generator P2 is connected to a base of the transistor Q8 in the third current path, and the negative output P2m from the pulse generator P2 is connected to a base of the transistor Q10 in the first current path. The maximum voltage P2H of the pulse generator P2 is connected to a base of the transistor Q9 in the second current path.

The second voltage drive circuit 750 further includes a comparator OP2 comparing a reference voltage Vref 2, which is generated between the resistance R9 and the transistor Q9, with an output voltage Vout. An output of the comparator OP2 is connected to bases of the transistors Q12 and Q13. The output point 112 of the output voltage generator 102 is connected with the output point 212 of the second output voltage generator 702. The output voltage Vout is generated at the output point 212.

It is assumed in the above constructed circuits that the input signal A and the input signal B do not become low at the same time. This means that at least one of the input signals A and B is always high.

When both of the input signal A and the input signal B are high, the currents do not flow in either the second current paths of the output voltage monitor 104 or the second output voltage monitor 704. Thus, the output voltage Vout becomes equal to the constant voltage VH. This is a first value of the output voltage Vout.

When the input signal A becomes low and the input signal B remains high, in the same way as the voltage drive circuit 100 shown in FIG. 2, the current flows in the first current path of the output voltage generator 102. At this time, the reference voltage Vref 1 in the second current path of the output voltage monitor 104 becomes equal to the expected voltage V1. Thus, the output voltage Vout becomes equal to the expected voltage V1.

When the input signal B becomes low and the input signal A remains high, the current flows in the first current path of the second output voltage generator 702. At this time, the reference voltage Vref 2 in the second current path of the second output voltage monitor 704 becomes equal to the expected voltage V2. Thus, the voltage Vout becomes equal to the expected voltage V2. As described above, the voltage drive apparatus 700 is capable of outputting three types of output voltage Vout.

Figure 5:
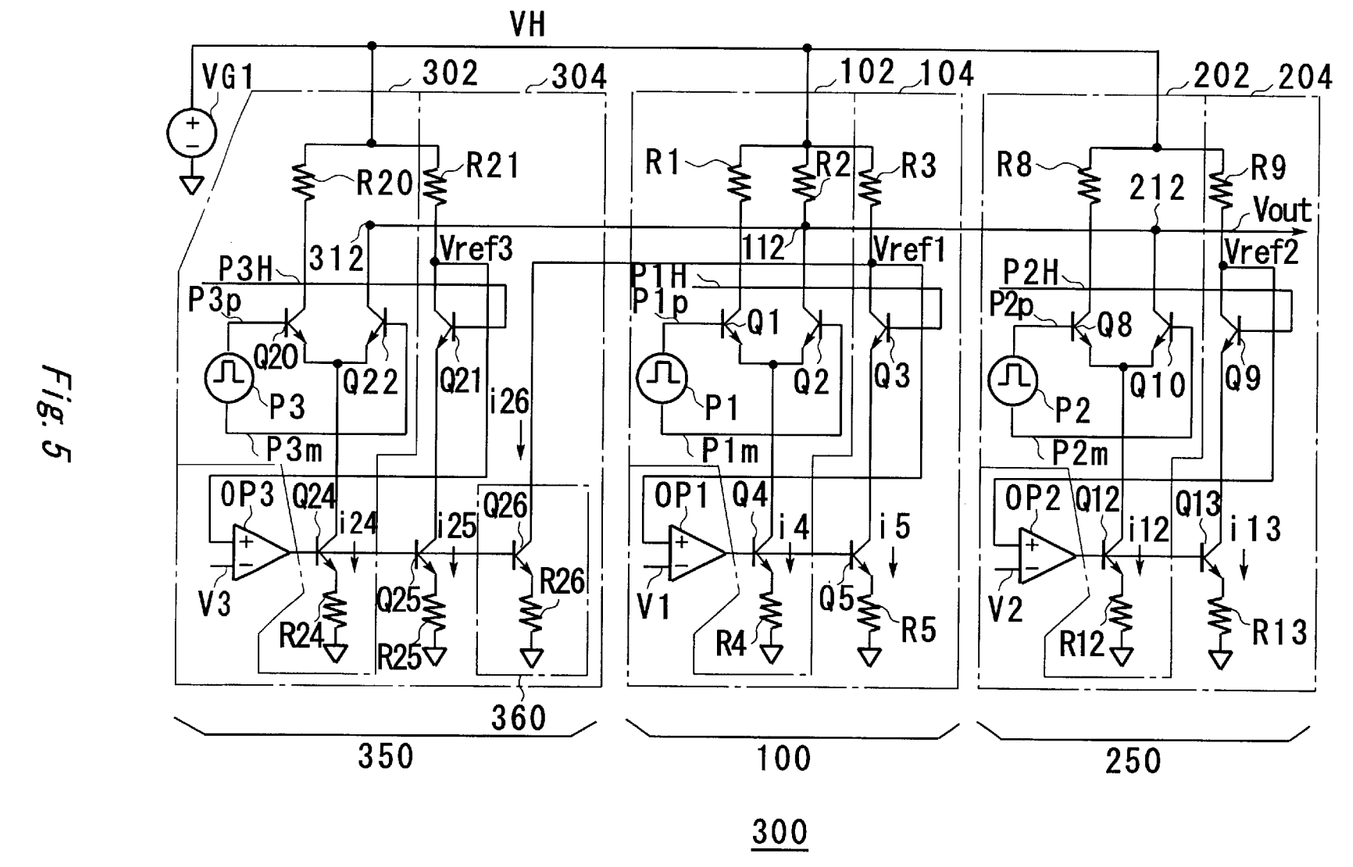
FIG. 5 shows a structure of a voltage drive apparatus including three of the voltage drive circuits shown in FIG. 2.

FIG. 5 shows a structure of a voltage drive apparatus 300 including the voltage drive circuit 100, the second voltage drive circuit 250, both shown in FIG. 2, and a third voltage drive circuit 350. In this embodiment, it is assumed that input signals to two of the circuits 100, 250 and 350 are low at the same time. Actually, it is assumed that when the input signal A of the voltage drive circuit 100 is low, an input signal C of the third voltage drive circuit 350 is always low.

The third voltage drive circuit 350 shares the resistance R2 with the voltage drive circuit 100 and the second voltage drive circuit 250. The third voltage drive circuit 350 includes an output voltage generator 302, which will be simply referred to as "a third output voltage generator 302" hereinafter. The resistance R2, a transistor Q22, a transistor Q24, and resistance R24 form a first current path, and a resistance R20, a transistor Q20, the transistor Q24, and the resistance R24 form a third current path, in the third voltage drive circuit 350.

The third voltage drive circuit 350 includes an output voltage monitor 304, which will be simply referred to as "a third output voltage monitor 304" hereinafter. A resistance R21, a transistor Q21, a transistor Q25 and a resistance R25 form a second current path in the third voltage drive circuit 350. The transistor Q21 is a 1/k transistor of the transistor Q22. The resistance value of the resistances R21 and R25 are respectively k times as large as that of the resistances R20 and R24. The third output voltage generator 302 includes a pulse generator P3 generating the input signal C. The positive output P3p from the pulse generator P3 is connected to a base of the transistor Q20 in the third current, and the negative output P3m from the pulse generator P3 is connected to a base of the transistor Q22 in the first current path. The maximum voltage P3H of the pulse generator P3 is input to a base of the transistor Q21 of the second current path.

The third output voltage generator 302 further includes a comparator OP3 comparing a reference voltage Vref3, which is generated between the resistance R21 and the transistor Q21, with an expected voltage V3. An output of the comparator OP3 is input to bases of the transistor Q24, the transistor Q25 and the transistor Q26. The transistor Q26 and a resistance R26 located between the transistor Q26 and the ground voltage form a connection circuit 360. The connection circuit 360 connects the voltage drive circuit 100 and the third voltage drive circuit 350. The reference voltage Vref1 of the output voltage monitor 104 is input to a collector of the transistor Q26.

It is assumed in this application that the expected voltage V3 of the third voltage drive circuit 350 is larger than the expected voltage V1 of the voltage drive circuit 100. It is also assumed that the resistance values of the resistances R25 and R26, and resistances R21 and R3 are respectively the same. The transistor Q25 and the transistor Q26 have the same characteristics. Thus, the current i26 flowing through the resistance R26 becomes equal to the current i25 flowing through the resistance R25. The output point 112 of the output voltage generator 102, the output point 112 of the second output voltage generator 202, and the output point 312 of the third output voltage generator 302 are connected with each other, and the output voltage Vout is generated at these points.

In this voltage drive apparatus 300, when all of the input signals A, B and C are high, the output voltage Vout becomes equal to the constant voltage VH. Then, when only the input signal B becomes low and the input signals A and C remain high, the second voltage drive circuit 250 functions to have the output voltage Vout equal the expected voltage V2. Similarly, when only the input signal C becomes low and the input signals A and B remain high, the third voltage drive circuit 350 functions to have the output voltage Vout equal the expected voltage V3.

When the input signal A becomes low, the input signal C also becomes low at the same time, based on the above assumption. The current i24 flows through the first current path of the third voltage drive circuit 350 when the input signal C becomes low. Thus, a shift voltage Vs2 is generated at both ends of the resistance R2 of the output voltage generator 102, caused by the voltage drop in the following.

$$Vs2=R2*i24 \quad\text{(formula 6)}$$

The shift voltage Vs2 is equal to a voltage drop Vs21 generated at both ends of the resistance R21 in the second current path of the third voltage drive circuit 350. From the above assumption, the current i26 flowing through the connection circuit 360 and the current i25 flowing through the resistance R25 are equal. A voltage drop Vs3 generated at the both ends of the resistance R3 of the output voltage monitor 104 included in the voltage drive circuit 100 becomes:

$$Vs3=R3*i26=R3*i25=R21*i25=Vs21=Vs2 \quad\text{(formula 7)}$$

The current i4 flows in the first current path of the voltage drive circuit 100 when the input signal A becomes low. Thus, a shift voltage Vs2' is generated at the both ends of the resistance R2 of the output voltage generator 102, caused by the voltage drop in the following.

$$Vs2'=R2*i4 \quad\text{(formula 8)}$$

The shift voltage Vs2' is equal to a voltage drop Vs3' generated at the both ends of the resistance R3 of the output voltage monitor 104.

From the above explanation related to the cases when each of the input signals A and C become low, a sum of the shift voltage obtained by simply adding the formula 6 and the formula 8 becomes:

$$\text{Sum}=Vs2+Vs2'=R2*i4+R2*i24 \quad\text{(formula 9)}$$

Thus, the output voltage Vout becomes:

$$V\text{out}=VH-(VH-V1)-(VH-V3) \quad\text{(formula 10)}$$

A sum of the shift voltage of the resistance R3 in the voltage drive circuit 100 becomes:

$$\text{Sum}=Vs3+Vs3'=Vs2+Vs2' \quad\text{(formula 11)}$$

Thus, the reference voltage Vref1 of the output voltage monitor 104 becomes:

$$V\text{ref1}=VH-(VH-V1)-(VH-V3)=V\text{out} \quad\text{(formula 12)}$$

However, in the voltage drive circuit 100, the current i5 is reduced such that the reference voltage Vref1 matches the expected voltage V1 due to the functions of the output voltage monitor 104 and the current drive circuit 106, not shown in FIG. 5 but shown in FIG. 2. From the formula 12, the output voltage Vout matches the reference voltage Vref1 while the reference voltage Vref1 matches the expected voltage V1. Thus, the output voltage Vout becomes equal to the expected voltage V1 in the end.

This means that the third voltage drive circuit 350 functions to reduces the output voltage Vout, from the constant voltage VH to the expected voltage V3. The voltage drive circuit 100 then reduces the output voltage Vout, from the expected voltage V3 to the expected voltage V1. The voltage drive apparatus 300 can be used when it is desired that the output voltage Vout is reduced to be equal to the expected voltage V3 when the input signal C is low, and the output voltage Vout is further reduced to be equal to the expected voltage V1 when the input signal A becomes low, in a case when the input signal C is slow and the input signal A is faster than the signal C.

The voltage drive apparatus 300 is capable of outputting four types of the output voltage Vout including VH, V1, V2 and V3. In addition, the voltage drive apparatus 300 is set not to output the constant voltage VH, provided that either of input signals A, B and C is always low. At this time, the voltage drive apparatus 300 is capable of outputting three types of output voltage Vout including V1, V2 and V3, regardless of the constant voltage VH.

Figure 6:
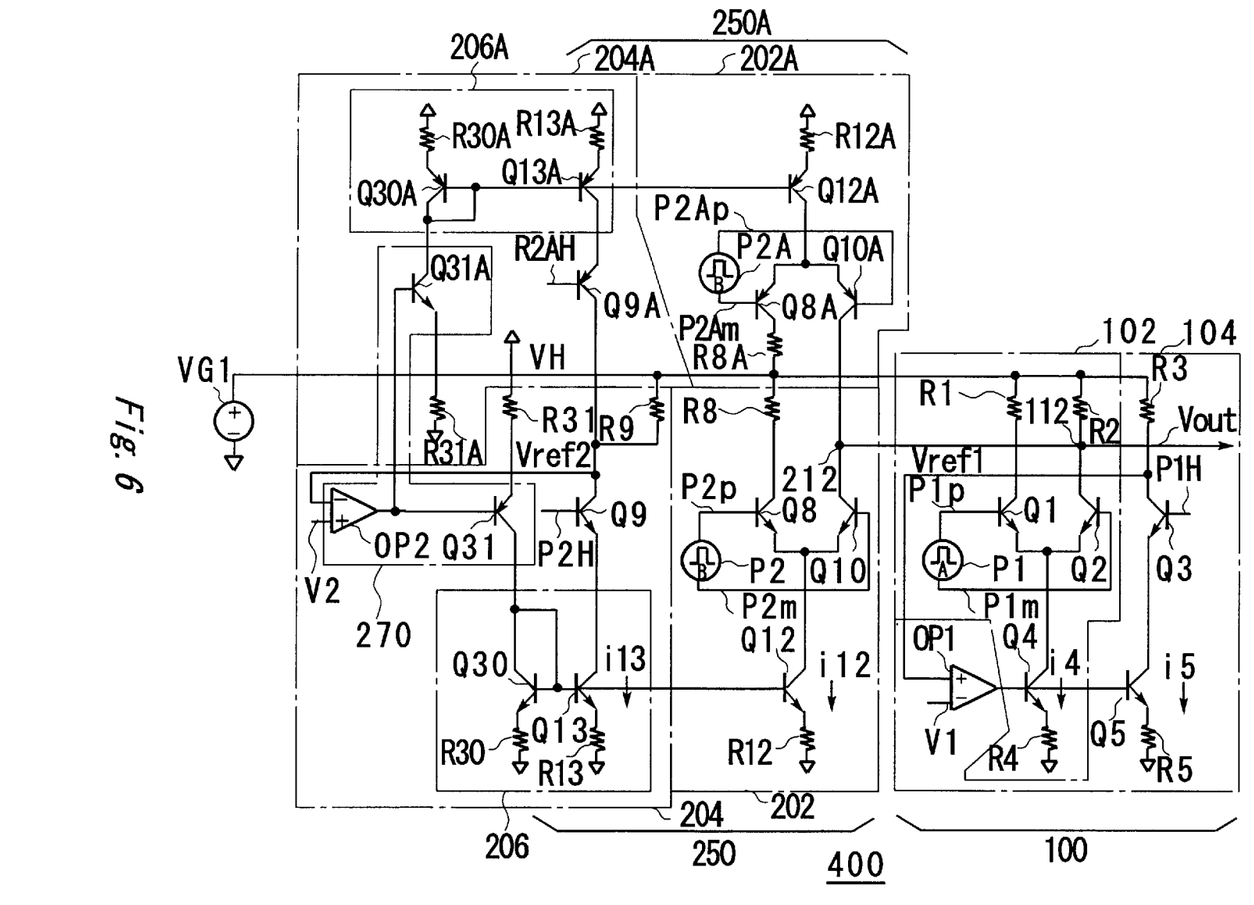
FIG. 6 shows a structure of a voltage drive apparatus including three of the voltage drive circuits shown in FIG. 2.

FIG. 6 shows a structure of another voltage drive apparatus 400. In this embodiment, a complementary circuit of the second voltage drive circuit 250, a third voltage drive circuit 250A, is constructed. Although the second voltage drive circuit 250 functions under the voltage range between the constant voltage VH and the ground voltage, the third voltage drive circuit 250A functions under the voltage range between the constant voltage VH and a higher voltage VHH. The general idea for this embodiment is that the second voltage drive circuit 250 and the third voltage drive circuit 250A are symmetrical with respect to the constant voltage VH. As in the second voltage drive circuit 250, all of the transistors are NPN type transistors, but in the third voltage drive circuit 250A, all of the transistors are PNP type transistors. The relative position of the transistor and the resistance of the third voltage drive circuit 250A with respect to the constant voltage VH is opposite to that of the second voltage drive circuit 250. In this embodiment, the voltage drive apparatus 400, including the third voltage drive circuit 250A, is capable of outputting the output voltage equal to the expected voltage V2, even when the expected voltage V2 is higher than the constant voltage VH.

The third voltage drive circuit 250A includes a complementary output voltage generator 202A and a complementary output voltage monitor 204A. The third voltage drive circuit 250A shares the resistance R2 with the voltage drive circuit 100 and the second voltage drive circuit 250. A resistance R12A, a transistor Q12A, a transistor Q10A, and the resistance R2 form a first current path, and a resistance R12A, a transistor Q12A, a transistor Q8A and a resistance R8A form a third current path, in the third voltage drive circuit 250A. The complementary output voltage monitor 204A includes a resistance R13A, a transistor Q13A, a transistor Q9A and a resistance R9 forming a second current path.

The third voltage drive circuit 250A further includes a pulse generator P2A generating a signal, which will be referred to as "an input signal B" for easy understanding, having the same pulses as the input signal B input to the second voltage drive circuit 250. The negative output P2Am of the pulse generator P2A is connected to a base of the transistor C8A in the third current path, and the positive output P2Ap of the pulse generator P2A is input to a base of the transistor Q10A of the first current path. The maximum voltage P2AH of the pulse generator P2A is input to a base of the transistor Q9A in the second current path.

The third voltage drive circuit 250A further includes a complementary current mirror circuit 206A formed by the resistance R13A, the transistor Q13A in the second current path, a resistance R30A and a transistor Q30A. The transistor Q31A which is controlled by the output from the comparator OP2 decides whether or not the current flows through the complementary current mirror circuit 206A.

The second voltage drive circuit 250 in this embodiment includes a current mirror circuit 206. The current mirror circuit 206 is formed by the transistor Q13, the resistance R13 in the second current path, the transistor Q30 and the resistance R30. The transistor Q31 which is controlled by the output from the comparator OP2 decides whether or not the current flows through the current mirror circuit 206.

The second voltage drive circuit 250 and the third voltage drive circuit 250A share the comparator OP2. The comparator OP2 compares the expected voltage V2 and the reference voltage Vref2. In this embodiment, the expected voltage V2 is supplied to the positive input of the comparator OP2, and the reference voltage Vref2 is supplied to the negative input of the comparator OP2. The comparator OP2, transistor Q31 of the second voltage drive circuit 250 controlled by the comparator OP2, and the transistor Q31A of the third voltage drive circuit 250A controlled by the comparator OP2 form a selecting circuit 270. The selecting circuit 270 functions to decide which of the second voltage drive circuit 250 and the third voltage drive circuit 250A will operate.

As for the voltage drive apparatus 400 in this embodiment, it is assumed that the expected voltage V2 is lower than the constant voltage VH. At this time, even when the third voltage drive circuit 250A functions, the reference voltage Vref2 generated by the function of the circuit 250A always becomes larger than the constant voltage VH. Therefore, the output from the comparator OP2 remains low, and thus the transistor Q31A of the third voltage drive circuit 250A remains switched off. As a result, the current does not flow through the transistor Q30A and the transistor Q13A of the complementary current mirror circuit 206A. Therefore, the current does not flow through the transistor Q12A forming the first current path. This means that when the expected voltage V2 is lower than the constant voltage VH, the third voltage drive circuit 250A does not function.

At this time, the current flows through the transistor Q31 of the second voltage drive circuit 250, thus, the current flows through the transistor Q30 and transistor Q13 of the current mirror circuit 206, and the transistor Q12 of the first current path. The second voltage drive circuit 250 functions the same as the voltage drive circuit 100 which is explained above. This means that the expected voltage V2 is output as the output voltage Vout when the input signal B is low, and the constant voltage VH is directly output as the output voltage Vout when the input signal B is high.

It is assumed in the following, that the expected voltage V2 is higher than the constant voltage VH. At this time, the output from the comparator OP2 remains high, and the transistor Q31 of the second voltage drive circuit 25D remains switched off. As a result, the current does not flow through the transistor Q30 and the transistor Q13 of the current mirror circuit 206. Therefore, the current does not flow through the transistor Q12 forming the first current path. This means that the second voltage drive circuit 250 does not function at this time.

The current flows through the transistor Q31A of the third voltage drive circuit 250A, thus, the current then flows through the transistor Q30A and the transistor Q13A of the complementary current mirror circuit 206A and the transistor Q12A of the first current path. Thus, the third voltage drive circuit 250A shows a desired function, and the expected voltage V2 or the constant voltage VH is output as the output voltage Vout.

In this case, it should be noted that the transistor Q10A in the first current path is switched on when the input signal B is low, and the expected voltage V2 is output as the output voltage Vout; while the transistor Q8A is switched on when the input signal B is high, and the constant voltage VH is output as the output voltage Vout. Because of the assumption that the expected voltage V2 is larger than the constant voltage VH, when the input signal B is low, the expected voltage V2 is output as the output voltage Vout.

The voltage drive apparatus 400 is capable of outputting three types of values including the constant voltage VH, the expected voltage V1 and the expected voltage V2 as the output voltage Vout. The voltage drive apparatus 400 is useful because the expected voltage V2 can be set to higher than the constant voltage VH.

Figure 7:
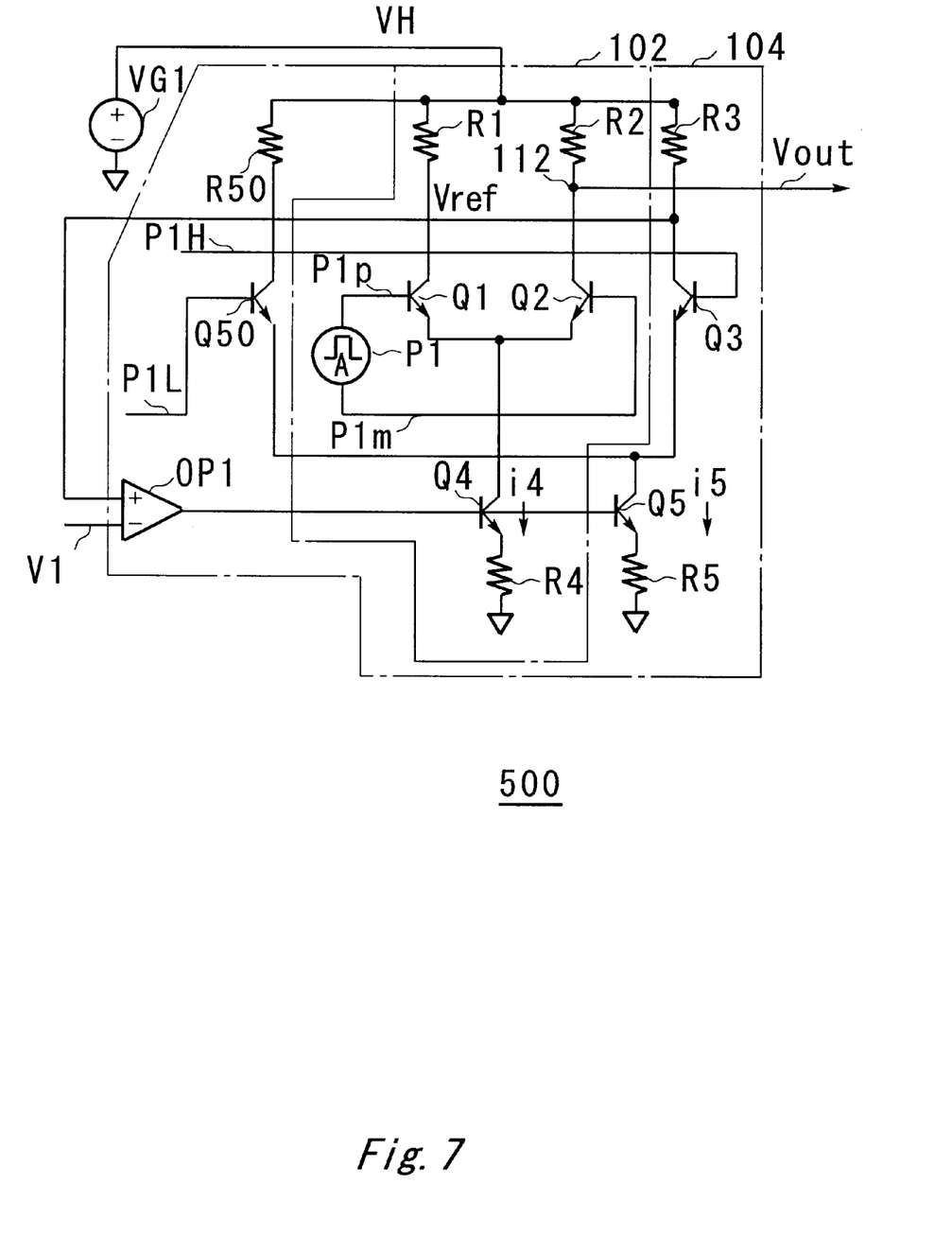
FIG. 7 shows a structure of a voltage drive circuit.

FIG. 7 shows an altered embodiment of the voltage drive circuit which can be incorporated in all of the embodiments described above. The voltage drive circuit 500 includes a fourth path in addition to the voltage drive circuit 100. The fourth current path is formed by a resistance R50, a transistor Q50, the transistor Q5, and the resistance R5. The resistance R50 has the same resistance value as that of the resistance R3 in the second current path. The transistor Q50 has the same characteristics as that of the transistor Q3. The transistor Q5 and the resistance R5 form the second current path and the fourth current path. The minimum voltage P1L of the pulse generator P1 is input to a base of the transistor Q50 in the fourth current path. The fourth current path shows inverted functions of the second current path, and thus compensates the current flowing in the voltage drive circuit 500.

The voltage drive circuit 500 is designed for the case in which the amplitude of the input signal A generated by the pulse generator P1 is not strong enough. This means that when the amplitude of the input signal A is weak, the transistor Q1 of the third current path may not be completely switched off, even when the transistor Q2 in the first current path switches on.

As for the voltage drive circuit 100 shown in FIG. 2, the reference voltage Vref is generated depending on the predetermined ratio k of the current i4 to the current i5 in the second current path, under the assumption that the current i4 flowing through the resistance R4 completely matches with the current flowing through the transistor Q2 in the first current path. However, when assuming that the current i4 of the transistor Q1 includes a leak current in the third current path, the current which should flow through the transistor Q2 in the first current path is reduced. Thus, the output voltage Vout becomes higher than the expected voltage V1.

Therefore, in the voltage drive circuit 500 of this embodiment, the fourth current path is provided as simulating the leak current of the transistor Q1 in the third current path. Then the leak current, which is 1/k times as large as the transistor Q1, is generated at the transistor Q50. The leak current of the transistor Q1 is generated when the minimum voltage of the input signal A, in other words, the minimum voltage P1L of the pulse generator P1, is supplied to the base of the transistor Q1. Thus, as for the fourth current path, the minimum voltage P1L is supplied to the base of the transistor Q50.

Figure 8:
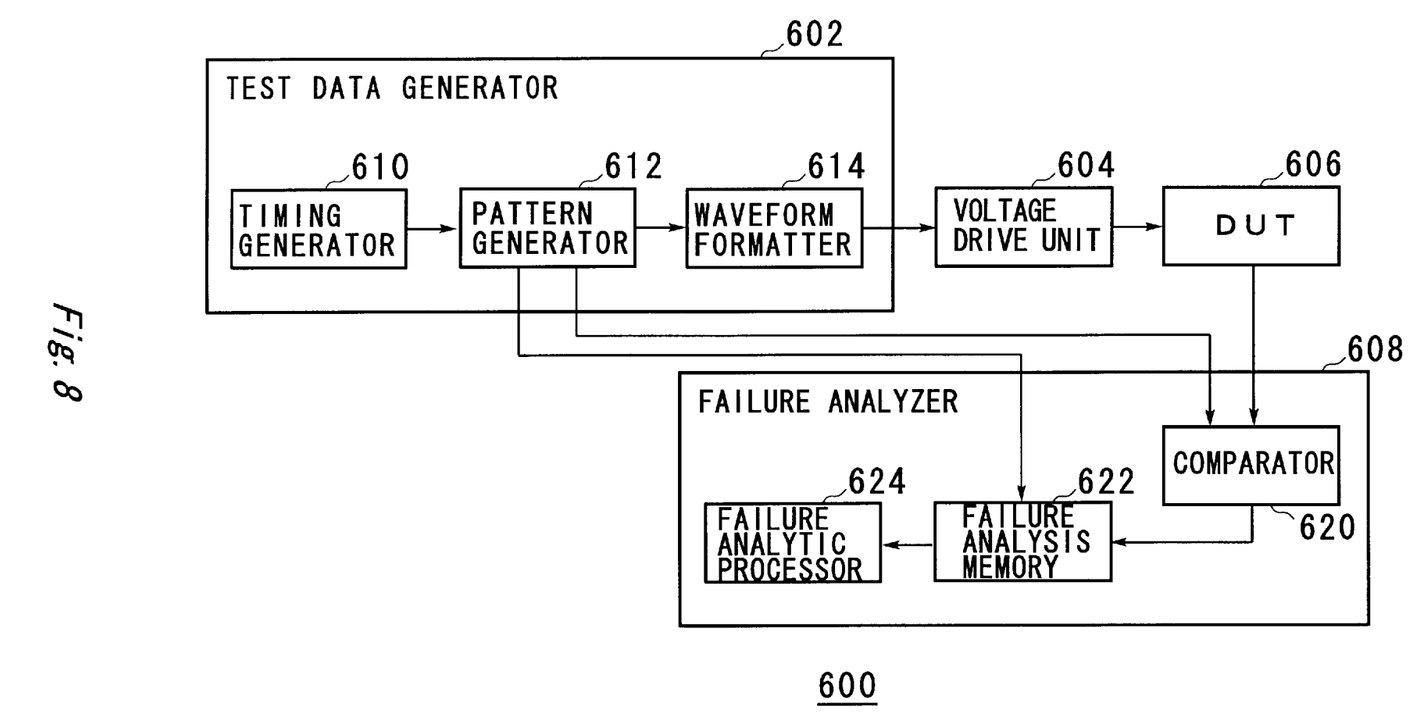
FIG. 8 shows a semiconductor-device testing apparatus of the embodiment according to the present invention.

FIG. 8 shows a structure of a semiconductor-device testing apparatus 600 including the voltage drive circuit. The semiconductor-device testing apparatus 600 includes a test data generator 602, a voltage drive unit 604 and a failure analyzer 608. The test data generator 602 generates test data as logic signals for writing on the DUT 606. The voltage drive unit 604 applies a desired voltage conversion to the test data generated by the test data generator 602. The failure analyzer 608 analyses the DUT when the DUT 606 treated by the voltage drive unit 604 has a failure.

The test data generator 602 includes a timing generator 610, a pattern generator 612 and a waveform formatter 614. The timing generator 610 generates timing necessary for generating test data with high-speed clocks. The pattern generator 612 generates patterns of the test data based on the timing generated by the test data generator 602. The waveform formatter 614 multi-processes the generated pattern for high-speed performances.

The failure analyzer 608 includes a comparator 620, a failure analysis memory 622 and a failure analytic processor 624. The comparator 620 compares the read out data from the DUT 606 and the expected output value generated by the pattern generator 612. The failure analysis memory 622 stores the failure when the read out data and the expected output value do not match, by referring to the addresses of the DUT 606. The failure analytic processor 624 analyses the failure stored in the failure analysis memory 622.

In the semiconductor-device testing apparatus 600 of this embodiment, the timing generator 610 generates an appropriate timing for the DUT 606, and then, the pattern generator 612 generates a test pattern based on the timing. The test pattern is processed by the waveform formatter 614 and then output to the voltage drive unit 604 as logic signals.

The voltage drive unit 604 generates different voltages depending on the two types of logic signals for testing the performance of the DUT 606 under the operational voltage margins. The voltages are generated as described above. The shapes of waveforms of the output voltage output from the voltage drive unit 604 are identical to those of the logic signal. Only the amplitude, in other words, the voltage, of the logic value is altered. The output voltage from the voltage drive unit 604 is input to the DUT 606.

The data is read out from the DUT 606 and the read out data is input to the failure analyzer 608. The failure analyzer 608 compares the read out data with the expected output value. When the read out data does not match the expected output value, the comparator 620 outputs failure information to the failure analysis memory 622. The failure analysis memory 622 refers to the address of the DUT 606 under testing at the time, and stores the failure information. The failure information will be read out from the failure analytic processor 624 and will be analyzed. The semiconductor-device testing apparatus 600 functions as above.

As the semiconductor-device testing apparatus 600 includes the voltage drive unit 604 which functions at a high-speed and generates a precise output voltage, the apparatus 600 can display high performance and is capable of conducting a test for a device related to the high-speed operation or the operational voltage margins.

Although bipolar transistors are used in the above embodiments, any types of transistors, for example MOSFETs, may be used, provided that they can be switched on and off. Furthermore, although voltage drops generated at both ends of resistances are used in the above embodiments in order to shift the output voltage Vout, any voltage gaps generated at both ends of components may be used.

According to the voltage drive circuit, the voltage drive apparatus in the above embodiments, a desired voltage can be precisely output in accordance with an input signal. The semiconductor-device testing apparatus of this embodiment is capable of precisely and effectively testing a semiconductor-device.

Although the present invention has been described by way of exemplary embodiments, it should be understood that many changes and substitutions may be made by those skilled in the art without departing from the spirit and the scope of the present invention which is defined only by the appended claims.

What is claimed is:

1. A voltage drive circuit generating a voltage in accordance with an input signal, comprising:
   an output voltage generator including:
      a current drive circuit having a current adjustable terminal;
      an output voltage generating transistor being switched on and off in accordance with said input signal;
      an output voltage generating resistance through which a current flows when said output voltage generating transistor is in a first operational state and being switched on; and
      an output point where an output voltage which is shifted from a predetermined voltage is generated by a voltage drop caused at both ends of said output voltage generating resistance; and
   an output voltage monitor including a comparator comparing said shifted output voltage with a predetermined expected voltage,
   wherein an output from said comparator is connected to said current adjustable terminal of said current drive circuit.

2. A voltage drive circuit as set forth in claim 1,
   wherein said output voltage monitor includes a reference voltage generating circuit generating a reference voltage whose ratio to said shifted output voltage is a predetermined value, and
   said comparator compares said reference voltage with said expected voltage.

3. A voltage drive circuit as set forth in claim 2,
   wherein said reference voltage generating circuit includes:
      a reference current drive circuit,
      a reference transistor being switched on and off and capable of being in a predetermined operational state; and
   a reference resistance through which a current flows, said current flows through said reference current drive circuit via said reference transistor.

4. A voltage drive circuit as set forth in claim 3,
   wherein said reference transistor has a structure such that current flowing therethrough is 1/k (k is a positive real number) times as large as current flowing through said output voltage generating transistor, when both of said reference transistor and said output voltage generating transistor are switched on, and
   said reference resistance has a resistance value which is k times as large as a resistance value of said output voltage generating resistance.

5. A voltage drive circuit as set forth in claim 3, wherein said reference current drive circuit has a current adjustable terminal, and an output of said comparator is connected to said current adjustable terminal of said reference current drive circuit.

6. A voltage drive circuit as set forth in claim 3,
   wherein said first operational state for said output voltage generating transistor and said predetermined operational state for said reference transistor are such that both of said transistors are switched on or both of said transistors are switched off, and said reference voltage becomes equal to said shifted output voltage when said output voltage generating transistor is in said first operational state.

7. A voltage drive circuit as set forth in claim 3, wherein said input signal is input to a base of said output voltage generating transistor and is capable of taking two types of values, and one of said two types of values of said input signal is constantly input to a base of said reference transistor.

8. A voltage drive circuit as set forth in claim 1, wherein said predetermined voltage is set to be higher than a ground voltage, said output voltage generating transistor is an NPN type transistor; and said output voltage generating resistance, said output point, and said output voltage generating transistor are cascaded with each other in this order, between said predetermined voltage and the ground voltage.

9. A voltage drive circuit as set forth in claim 8, wherein said reference transistor is an NPN type transistor, said reference resistance and said reference transistor are cascaded with each other in this order, between said predetermined voltage and the ground voltage, and said reference voltage is generated between said reference resistance and said reference transistor.

10. A voltage drive circuit generating a voltage in accordance with an input signal, comprising:

an output voltage generator including:
　a first circuit generating a predetermined voltage and an output voltage which is shifted from said predetermined voltage in accordance with a value of said input signal; and
　an output point where said shifted output voltage is generated; and an output voltage monitor including:
　a second circuit generating a reference voltage whose ratio to said shifted output voltage is a predetermined value; and
　a comparator comparing said reference voltage with a predetermined expected voltage;

wherein said shifted output voltage shifted by said output voltage generator is adjusted based on an output from said comparator.

11. A voltage drive circuit as set forth in claim 10, wherein said first circuit generating said shifted output voltage includes a first current path through which different currents flow in accordance with values of said input signal, and generates said shifted output voltage by said current flowing through said first current path; and said second circuit generating said reference voltage includes a second current path through which a current whose ratio to a maximum current flowing through said first current path is a predetermined value flows, and generates said reference voltage by said current flowing through said second current path.

12. A voltage drive circuit as set forth in claim 11, wherein said first current path is formed by:
　an output voltage generating transistor being switched on and off in accordance with said input signal; and
　an output voltage generating resistance through which a current flows when said output voltage generating transistor is in a first operational state; and said second current path is formed by:
　a reference transistor being switched on and off and capable of being in a predetermined operational state; and
　a reference resistance through which a current flows, said current flowing through said reference transistor.

13. A voltage drive circuit as set forth in claim 11, wherein said output voltage generator further includes a third current path through which a current flows, and sum of said current flowing in said first current path and said current flowing in said third current path is constant, and said output voltage monitor further includes a fourth current path through which a current whose ratio to a minimum current flowing through said third current path is a predetermined value.

14. A voltage drive circuit as set forth in claim 13, wherein said third current path is formed by:
　a first complementary transistor compensating said output voltage generating transistor; and
　a first complementary resistance through which a current flows when said first complementary transistor is in a first operational state; and said fourth current path is formed by:
　a second complementary transistor having an opposite operational state against said predetermined operational state of said reference transistor; and
　a second complementary resistance through which a current flows, said current flowing through said second complementary transistor.

15. A voltage drive circuit as set forth in claim 11, wherein said first current path and said third current path are connected to a main current drive circuit, said main current drive circuit being controlled by an output from said comparator.

16. A voltage drive circuit as set forth in claim 15, wherein said second current path and said fourth current path are connected to a sub current drive circuit, said sub current drive circuit being controlled by an output from said comparator.

17. A voltage drive circuit as set forth in claim 11, wherein said input signal is input to a base of said output voltage generating transistor, and one of two types of voltages of said input signal is input to a base of said reference transistor.

18. A voltage drive circuit as set forth in claim 17, wherein a reversed signal of said input signal is input to a base of said first complementary transistor, and the other of two types of voltages of said input signal is input to a base of said second complementary transistor.

19. A voltage drive circuit comprising first to nth (n is an integer equal or larger than two) voltage drive circuits as set forth in claim 1, wherein said expected voltages for each of said first to nth voltage drive circuits are set to have different values; and said output points for each of said first to nth voltage drive circuits are connected with each other.

20. A voltage drive circuit as set forth in claim 19, further comprises a connection circuit connecting a first shift voltage which is a differential voltage of said predetermined voltage and said shifted output voltage of said first voltage drive circuit, to said second voltage drive circuit.

21. A voltage drive circuit as set forth in claim 20, wherein said connection circuit generates an adjusted second shift voltage by adding said first shift voltage to a second shift voltage which is a differential voltage of said predetermined voltage and said shifted output voltage of said second voltage drive circuit.

22. A voltage drive circuit as set forth in claim 19,
wherein said first voltage drive circuit and said second voltage drive circuit are constructed so as to be compensating each other,
said first voltage drive circuit is located so as to be operated under a voltage ranging from a ground voltage to a first voltage higher than said ground voltage, and
said second voltage drive circuit is located so as to be operated under a voltage ranging from said first voltage to a second voltage higher than said first voltage.

23. A voltage drive circuit as set forth in claim 22,
wherein said comparator is constructed so as to be shared by said first voltage drive circuit and said second voltage drive circuit, and
said voltage drive circuit further comprises a selecting circuit selecting either of said first voltage drive circuit and said second voltage drive circuit such that said first voltage drive circuit functions when said expected voltage is lower than said first voltage input to said shared comparator, and said second voltage drive circuit functions when said expected voltage is higher than said first voltage.

24. An apparatus for testing a semiconductor-device, comprising:
a test data generator generating a logic signal to be applied to said semiconductor-device;
a voltage drive unit converting said logic signal to a test signal having a desired voltage; and
a failure analyzer judging whether said semiconductor-device has a failure or not by reading data from said semiconductor-device;
wherein said voltage drive unit includes a voltage drive circuit as set forth in claim 1, receiving said logic signal as an input signal and outputting said test signal as a shifted output voltage.

25. A voltage drive apparatus comprising a first voltage drive circuit generating a voltage in accordance with a first input signal and a second voltage drive circuit generating a voltage in accordance with a second input signal:
wherein said first voltage drive circuit comprises:
a first output voltage generator including:
a first current drive circuit having a first current adjustable terminal;
a first output voltage generating transistor being switched on and off in accordance with said first input signal;
an output voltage generating resistance through which a current flows when said first output voltage generating transistor is in a first operational state, said current flowing through said first current drive circuit; and
a first output point where a first output voltage which is shifted from a predetermined voltage is generated by a voltage drop caused at both ends of said output voltage generating resistance, and
a first output voltage monitor including a comparator which compares said shifted first output voltage with a predetermined first expected voltage, wherein an output from said comparator being connected to said first current adjustable terminal, and
said second voltage drive circuit comprises:
a second output voltage generator including:
a second current drive circuit having a second current adjustable terminal;
a second output voltage generating transistor being switched on and off in accordance with said second input signal; and
a second output point where a second output voltage being shifted from a predetermined voltage is generated by a voltage drop caused at both ends of said output voltage generating resistance, by a current flowing through said output voltage generating resistance when said second output voltage generating transistor is in a first operational stat, said current flowing through said second current drive circuit, and
a second output voltage monitor including a second comparator comparing said shifted second output voltage with a predetermined second expected voltage, an output from said comparator being connected to said second current adjustable terminal.

26. A voltage drive apparatus as set forth in claim 25, wherein said first output point and said second output point are connected with each other.

27. A voltage drive apparatus as set forth in claim 26,
wherein said first output voltage monitor includes a first reference voltage generating circuit generating a first reference voltage whose ratio to said first output voltage is a predetermined value,
said first comparator compares said first reference voltage with said first expected voltage,
said second output voltage monitor includes a second reference voltage generating circuit generating a second reference voltage whose ratio to said second output voltage is a predetermined value, and
said second comparator compares said second reference voltage with said second expected voltage.

28. A voltage drive circuit as set forth in claim 27,
wherein said first output voltage generator includes a first complementary transistor compensating said first output voltage generating transistor, and a first complementary resistance through which a current flows when said first complementary transistor is in a first operational state, said current flowing through said first current drive circuit, and
said second output voltage generator includes a second complementary transistor compensating said second output voltage generating transistor.

29. A voltage drive circuit as set forth in claim 28,
wherein said second output voltage generator includes a secondary complementary transistor is in a first operational state, said current flowing through said second current drive circuit.

30. A voltage drive circuit as set forth in claim 28, further comprising a connection circuit connecting an output from said first complementary resistance to said second complementary transistor.

* * * * *